(12) United States Patent
Yabe

(10) Patent No.: US 7,123,504 B2
(45) Date of Patent: Oct. 17, 2006

(54) SEMICONDUCTOR INTEGRATED CIRCUIT DEVICE HAVING STATIC RANDOM ACCESS MEMORY MOUNTED THEREON

(75) Inventor: Tomoaki Yabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 10/918,642

(22) Filed: Aug. 16, 2004

(65) Prior Publication Data
US 2005/0232058 A1 Oct. 20, 2005

(30) Foreign Application Priority Data
Apr. 15, 2004 (JP) ............... 2004-120265

(51) Int. Cl.
*G11C 11/00* (2006.01)
(52) U.S. Cl. ............ 365/156; 365/154; 257/903; 257/904
(58) Field of Classification Search ............ None
See application file for complete search history.

(56) References Cited

U.S. PATENT DOCUMENTS 5,966,319 A * 10/1999 Sato .................. 365/154
6,091,626 A * 7/2000 Madan ................ 365/154
6,765,817 B1 * 7/2004 Takemura ............ 365/154
2005/0002215 A1 * 1/2005 Morishima ........... 365/120

FOREIGN PATENT DOCUMENTS

JP 2000-58675 2/2000
JP 2003-151277 5/2003

OTHER PUBLICATIONS

Kevin Zhang, et al., "The Scaling of Data Sensing Schemes for High Speed Cache Design in Sub-0.18 μm Technologies", Tech. Dig. of VLSI Circuits Symp., Jun. 2000, pp. 226-227.

* cited by examiner

*Primary Examiner*—Son Mai
(74) *Attorney, Agent, or Firm*—Oblon, Spivak, McClelland, Maier & Neustadt, P.C.

(57) ABSTRACT

A semiconductor integrated circuit device is configured by eight transistors including the six transistors configuring the data holding section and the two NMOS transistors configuring the reading stage. The threshold voltage of the NMOS transistors configuring the reading stage is set low and the threshold voltage of the six transistors configuring the data holding section is set higher than the threshold voltage of the NMOS transistors configuring the reading stage. The cell current flowing from the bit line to the ground terminal can be set large and the large static noise margin (SNM) can be attained.

5 Claims, 7 Drawing Sheets

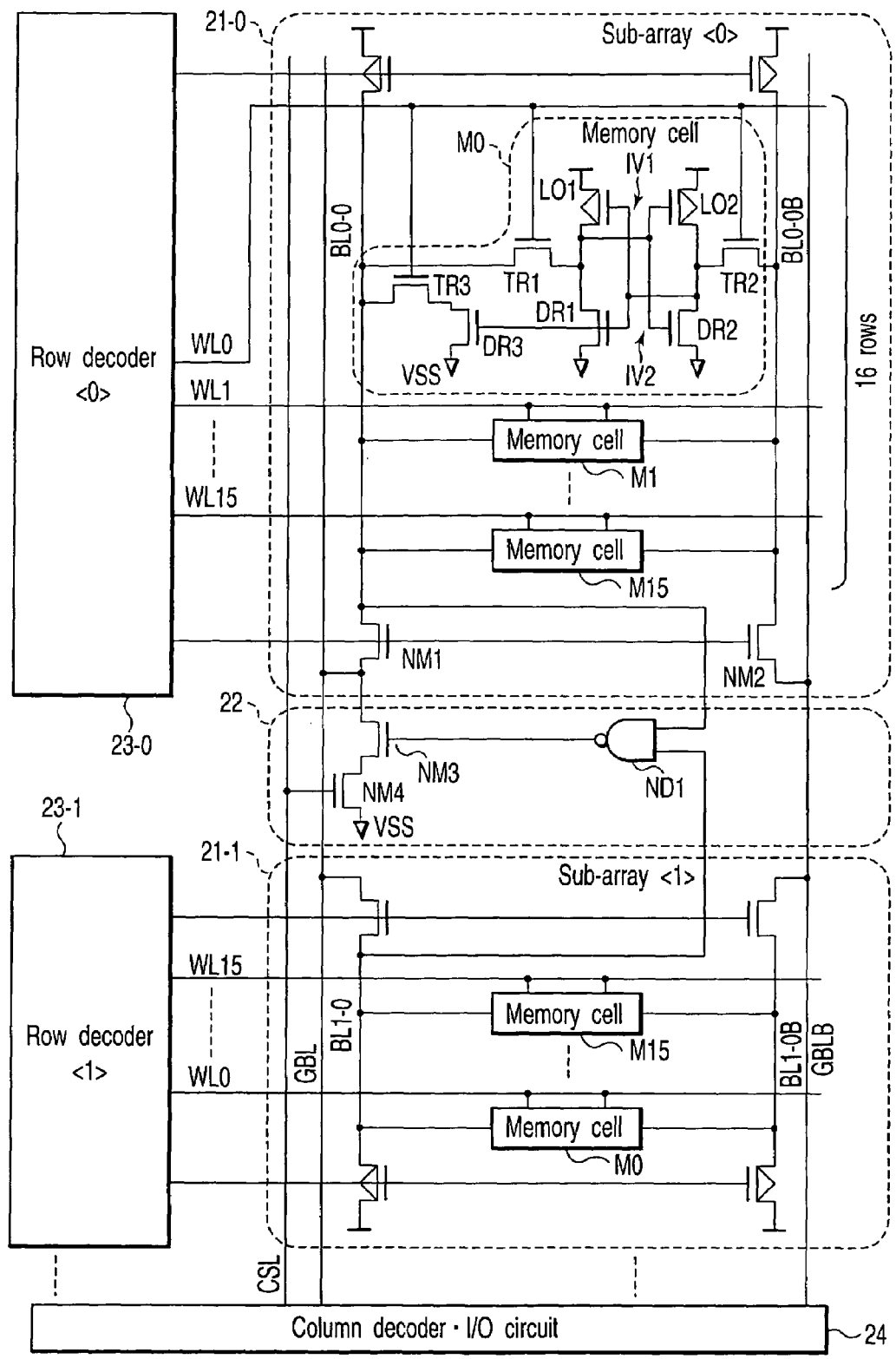
F I G. 4

SEMICONDUCTOR INTEGRATED CIRCUIT DEVICE HAVING STATIC RANDOM ACCESS MEMORY MOUNTED THEREON

CROSS-REFERENCE TO RELATED APPLICATIONS

This application is based upon and claims the benefit of priority from prior Japanese Patent Application No. 2004-120265, filed Apr. 15, 2004, the entire contents of which are incorporated herein by reference.

BACKGROUND OF THE INVENTION

1. Field of the Invention

This invention relates to a static random access memory (which is hereinafter referred to as an SRAM) and is utilized for a semiconductor integrated circuit device having an SRAM mounted thereon, for example.

2. Description of the Related Art

In recent years, various problems appear in the SRAM with an increase in the memory capacity and a lowering in the voltage. The prior art of the SRAM and the problem associated therewith are explained below with reference to FIGS. 1 and 2.

FIG. 1 is a circuit diagram of a memory cell (which is hereinafter referred to as an SRAM cell) used to configure a conventional 6-transistor SRAM. The conventional SRAM cell has first and second inverters I1, I2 which are cross coupled and respectively connected to complementary paired bit lines BL, /BL via first and second transfer gate transistors T1 and T2. The first, second inverters I1, I2 are respectively configured by first, second driver transistors D1, D2 and first, second load transistors L1, L2 (for example, refer to FIG. 2 in Jpn. Pat. Appln. KOKAI Publication No. 2000-58675). In this case, the transfer gate transistors T1 and T2, driver transistors D1, D2 and load transistors L1, L2 are designed to have the same gate length (L), the same gate width (W) and the same threshold voltage (Vth).

At the read time, cell data is read out to the bit line pair by activating the word line WL to drive one of the paired bit lines BL and /BL to the "L" potential side by use of a cell current Ic. Further, at the write time, data is written into a memory cell by activating the word line WL to bias the paired bit lines BL, /BL to desired data polarities.

FIG. 2 shows a bistable characteristic (butterfly curve) indicating the data storage stability in the conventional SRAM cell. The curve indicates the transfer curve (VNB-VNA static characteristic) of the first inverter I1 obtained by respectively plotting VNB, VNA on the abscissa and ordinate and the transfer curve of the second inverter I2 obtained by respectively plotting VNA, VNB on the abscissa and ordinate where VNA, VNB indicate storage node potentials of the SRAM cell shown in FIG. 1.

At this time, the word line WL and bit line pair BL, /BL are biased to power supply voltage VDD. In FIG. 2, the state in which the SRAM cell holds "1" data, that is, the node potential VNA is set at "H" and the node potential VNB is set at "L" corresponds to an intersection XB of the above two transfer curves and the state in which the SRAM cell holds "0" data corresponds to an intersection XA.

The length of one side of maximum squares which respectively internally touch two regions surrounded by the two transfer curves is defined as a static noise margin (SNM). Generally, the stability of data stored in the SRAM cell becomes higher and data destruction due to power supply voltage noise in the chip becomes more difficult to occur as the static noise margin becomes larger. Therefore, it becomes important to set a large static noise margin when designing the SRAM cell.

Further, the X coordinate of a point A at which the transfer curve starts to drop from the power supply voltage VDD is set to threshold voltage Vthn of the driver transistor D1. As is clearly understood from FIG. 2, the static noise margin can be enlarged by enhancing the threshold voltage Vthn of the driver transistor D1. In this case, however, if the threshold voltage Vthn is enhanced, the cell current Ic is reduced and the operation speed is lowered.

Thus, in the conventional case, an attempt to enhance the stability (increase SNM) of data storage in the SRAM cell and setting a larger cell current are set in a trade-off relation when the threshold voltage of the driver transistor is set. In recent years, as the SRAM cell is miniaturized and the driving voltage becomes lower, the problems that the set window of the threshold voltage of the driver transistor which simultaneously satisfies the above two conditions becomes narrower and the cell designing becomes difficult occur.

BRIEF SUMMARY OF THE INVENTION

A semiconductor integrated circuit device according to one aspect of the present invention comprises first and second inverters, first, second and third transfer gate transistors and a read driver transistor.

The first inverter has a first input terminal and a first output terminal. The second inverter has a second input terminal and a second output terminal. The first output terminal of the first inverter is connected to the second input terminal of the second inverter and the first input terminal of the first inverter is connected to the second output terminal of the second inverter. The first transfer gate transistor has a first gate terminal and one end and the other end of a first current path. The first gate terminal is connected to a word line, one end of the first current path is connected to a first bit line and the other end of the first current path is connected to the first output terminal of the first inverter and the second input terminal of the second inverter. The second transfer gate transistor has a second gate terminal and one end and the other end of a second current path. The second gate terminal is connected to the word line, one end of the second current path is connected to a second bit line and the other end of the second current path is connected to the second output terminal of the second inverter and the first input terminal of the first inverter. The third transfer gate transistor has a third gate terminal and one end and the other end of a third current path. The third gate terminal is connected to the word line and one end of the third current path is connected to the first bit line. The read driver transistor has a fourth gate terminal and one end and the other end of a fourth current path. The fourth gate terminal is connected to the first input terminal of the first inverter and the second output terminal of the second inverter. Further, one end of the fourth current path is connected to the other end of the third current path of the third transfer gate transistor and the other end of the fourth current path is supplied with ground potential.

A semiconductor integrated circuit device according to another aspect of the present invention comprises a plurality of sub-arrays, a plurality of first and second local bit lines, a first global bit line, a second global bit line, a plurality of first transfer gates, a plurality of second transfer gates, and a bit line buffer.

The plurality of sub-arrays each have memory cells arranged in a matrix form. The plurality of first and second local bit lines are connected to the memory cells of each of the plurality of sub-arrays. The first global bit line is commonly used by the plurality of first local bit lines. The second global bit line is commonly used by the plurality of second local bit lines. The plurality of first transfer gates set the connected state or disconnected state between each of the plurality of first local bit lines and the first global bit line. The plurality of second transfer gates set the connected state or disconnected state between each of the plurality of second local bit lines and the second global bit line. The bit line buffer drives the first global bit line according to the potential of the first local bit line.

The memory cell includes first and second inverters, first, second and third transfer gate transistors and a read driver transistor.

The first inverter has a first input terminal and a first output terminal. The second inverter has a second input terminal and a second output terminal. The first output terminal of the first inverter is connected to the second input terminal of the second inverter and the first input terminal of the first inverter is connected to the second output terminal of the second inverter. The first transfer gate transistor has a first gate terminal and one end and the other end of a first current path. The first gate terminal is connected to a word line, one end of the first current path is connected to a first bit line and the other end of the first current path is connected to the first output terminal of the first inverter and the second input terminal of the second inverter. The second transfer gate transistor has a second gate terminal and one end and the other end of a second current path. The second gate terminal is connected to the word line, one end of the second current path is connected to a second bit line and the other end of the second current path is connected to the second output terminal of the second inverter and the first input terminal of the first inverter. The third transfer gate transistor has a third gate terminal and one end and the other end of a third current path. The third gate terminal is connected to the word line and one end of the third current path is connected to the first bit line. The read driver transistor has a fourth gate terminal and one end and the other end of a fourth current path. The fourth gate terminal is connected to the first input terminal of the first inverter and the second output terminal of the second inverter. Further, one end of the fourth current path is connected to the other end of the third current path of the third transfer gate transistor and the other end of the fourth current path is supplied with ground potential.

BRIEF DESCRIPTION OF THE SEVERAL VIEWS OF THE DRAWING

FIG. 4 is a circuit diagram showing the configuration of the static random access memory according to the first embodiment;

DETAILED DESCRIPTION OF THE INVENTION

There will now be described embodiments of the present invention with reference to the accompanying drawings. In this explanation, common reference symbols are attached to like portions throughout the drawings.

First Embodiment

First, a semiconductor integrated circuit device having a static random access memory of a first embodiment of the present invention is explained with reference to FIGS. 3 to 10.

Figure 3:
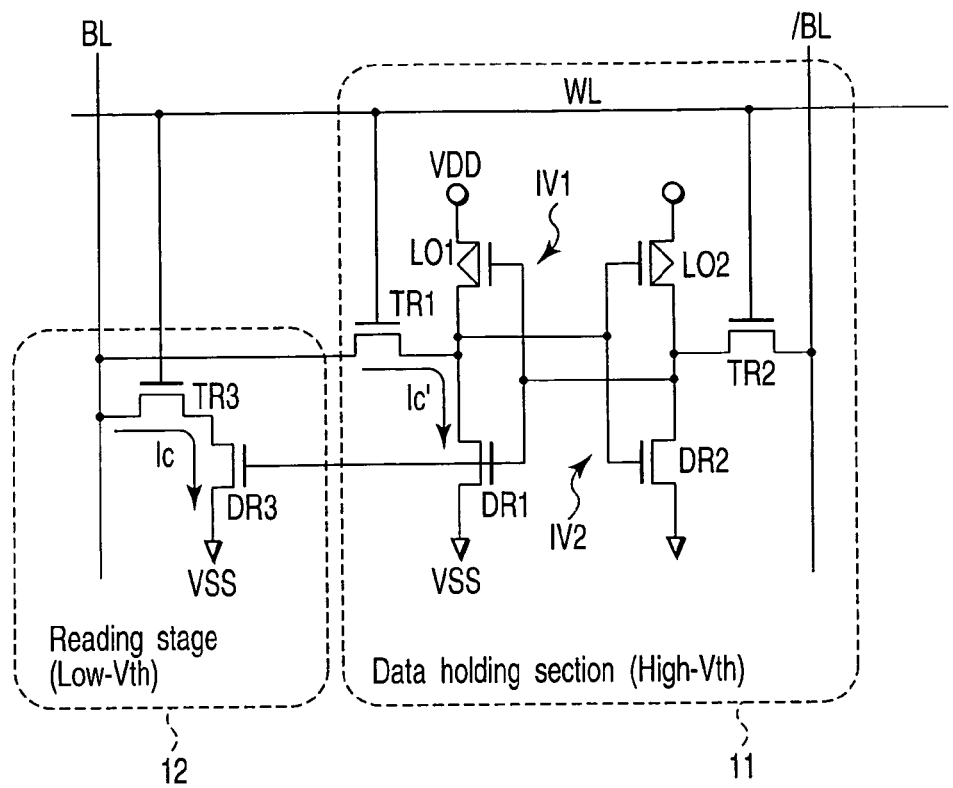
FIG. 3 is a circuit diagram of a memory cell (SRAM cell) in a static random access memory according to a first embodiment of the present invention.

FIG. 3 is a circuit diagram showing the configuration of an SRAM cell according to the first embodiment. The SRAM cell includes a data holding section 11 configured by six transistors and a reading stage 12 configured by two N-channel MOS field effect transistors (which are hereinafter referred to as NMOS transistors). The data holding section 11 includes a first inverter IV1, second inverter IV2, first transfer gate transistor TR1 and second transfer gate transistor TR2. The reading stage 12 includes a third transfer gate transistor TR3 and read driver transistor DR3. The first inverter IV1 includes a first load transistor LO1 and first driver transistor DR1 and the second inverter IV2 includes a second load transistor LO2 and second driver transistor DR2.

The first, second load transistors LO1, LO2 are each configured by a P-channel MOS field effect transistor (which is hereinafter referred to as a PMOS transistor) and the first, second driver transistors DR1, DR2 are each configured by an NMOS transistor. The first inverter IV1 is a CMOS inverter configured by the first load transistor (PMOS transistor) LO1 and first driver transistor (NMOS transistor) DR1. Likewise, the second inverter IV2 is a CMOS inverter configured by the second load transistor (PMOS transistor) LO2 and second driver transistor (NMOS transistor) DR2.

Further, the threshold voltage of at least one of the third transfer gate transistor TR3 and read driver transistor DR3 is set lower than the threshold voltage of the first, second transfer gate transistors TR1, TR2 and the first, second driver transistors DR1, DR2 configuring the first, second inverters IV1, IV2 by preset voltage or more. In this case, it is preferable to set the preset voltage to voltage, for example, 50 mV or more which is higher than a variation in the threshold voltages of the NMOS transistors.

The gate terminal of the first transfer gate transistor TR1 is connected to a word line WL and one of the source terminal and drain terminal (one end of the current path) thereof is connected to a bit line BL. The other one of the source terminal and drain terminal (one end of the current path) thereof is connected to the output terminal of the first inverter IV1 and the input terminal of the second inverter IV2. The gate terminal of the second transfer gate transistor TR2 is connected to the word line WL and one of the source terminal and drain terminal thereof is connected to a bit line /BL. The other one of the source terminal and drain terminal thereof is connected to the output terminal of the second inverter IV2 and the input terminal of the first inverter IV1.

The gate terminal of the third transfer gate transistor TR3 is connected to the word line WL and one of the source terminal and drain terminal thereof is connected to the bit line BL. The gate terminal of the read driver transistor DR3 is connected to the input terminal of the first inverter IV1 and the output terminal of the second inverter IV2. One of the source terminal and drain terminal of the read driver transistor DR3 is connected to the other one of the source terminal and drain terminal of the third transfer gate transistor TR3 and the other one of the source terminal and drain terminal thereof is supplied with reference potential VSS such as ground potential.

The source terminal of the first load transistor LO1 is supplied with the power supply voltage VDD and the drain terminal thereof is connected to the drain terminal of the first driver transistor DR1 and the other one of the source terminal and drain terminal of the first transfer gate transistor TR1. Further, the source terminal of the first driver transistor DR1 is supplied with the reference potential VSS. In addition, the gate terminal of the first load transistor LO1 is connected to the gate terminal of the first driver transistor DR1 and the gate terminal of the read driver transistor DR3. The node of the gate terminals configures the input terminal of the first inverter.

The source terminal of the second load transistor LO2 is supplied with the power supply voltage VDD and the drain terminal thereof is connected to the drain terminal of the second driver transistor DR2 and the other one of the source terminal and drain terminal of the second transfer gate transistor TR2. Further, the source terminal of the second driver transistor DR2 is supplied with the reference potential VSS. In addition, the gate terminal of the second load transistor LO2 is connected to the gate terminal of the second driver transistor DR2. The node of the gate terminals configures the input terminal of the second inverter.

FIG. 4 is a circuit diagram showing the configuration of the static random access memory to which the SRAM cell is applied. In this case, for example, assume that the memory cell array is divided into 64 sub-arrays and each sub-array has 16 word lines and 512 pairs of local bit lines.

The memory cell array is divided into a plurality of sub-arrays <0>21-0, <1>21-1, . . . , <63>21-63 and bit line buffers 22 are each arranged between corresponding two of the sub-arrays. Each of the sub-arrays has a plurality of memory cells arranged in a matrix form, but in FIG. 4, only memory cells M0, M1, . . . , M15 of one column are shown. Word lines WL0, WL1, . . . , WL15 and paired local bit lines BL0-0, BL0-0B are connected to the memory cells M0 to M15. Further, row decoders 23-0, 23-1, . . . , 23-63 are connected to the respective sub-arrays and a column decoder and input/output (I/O) circuit 24 is connected to the sub-arrays. Each row decoder decodes a row address input from the exterior to select one of the word lines WL0 to WL15. The column decoder decodes a column address input from the exterior to select a column selection line CSL.

Each sub-array has 512 pairs of local bit lines, but in the sub-array <0> shown in FIG. 4, one pair of local bit lines BL0-0, BL0-0B are shown. The local bit lines BL0-0, BL0-0B are respectively connected to global bit lines GBL, GBLB via write transfer gates NM1, NM2. The global bit lines GBL, GBLB are commonly provided for all of the sub-arrays <0> to <63>. The input/output (I/O) circuit 24 is used to perform the read/write operation with respect to the memory cells in the sub-arrays <0> to <63> via the global bit lines GBL, GBLB.

Further, one of the paired local bit lines, for example, local bit line BL0-0 is connected to the global bit line GBL via a read NAND buffer ND1 and global bit line read driver NM3. The source of the global bit line read driver NM3 is connected to the drain of a column switch NM4 whose source is supplied with reference potential VSS such as ground potential. The gate of the column switch NM4 is connected to the column selection line CSL which is driven by the column decoder 24.

In the SRAM with the above configuration, the read operation is performed by use of a bit line on one side of the bit line pair and the write operation is performed by use of both of the paired bit lines as will be described below.

At the read time, if the local bit line BL0-0 is set to "L" via the memory cell when the column is selected (when the column selection line CSL is set at "H"), that is, if "0" data is stored in the memory cell, the read driver NM3 is turned ON via the read NAND buffer ND1. Thus, the global bit line GBL is driven to "L" and "0" data is read out by the input/output (I/O) circuit 24. Further, in a case where the local bit line BL0-0 is kept in the "H" state, that is, if "1" data is stored in the memory cell, the read driver NM3 is turned OFF. Thus, the global bit line GBL is kept in the "H" state and "1" data is read out by the input/output (I/O) circuit 24.

At the write time, both of the paired local bit lines BL0-0, BL0-0B and both of the paired global bit lines GBL, GBLB are used. Then, desired data is written into the memory cell by driving the paired local bit lines BL0-0, BL0-0B via the write transfer gates NM1, NM2 according to potentials of the paired global bit lines GBL, GBLB.

As described before, in this embodiment, a so-called one-side (single) bit line read system is used in which data stored in the memory cell is read out by use of one of the paired local bit lines BL0-0, BL0-0B and one of the paired global bit lines GBL, GBLB. In the one-side bit line read system, it is necessary to fully swing the potential of the local bit line BL0-0 at high speed in order to detect a potential level of the bit line by use of the read NAND buffer ND1. In order to meet the above requirement, the capacity of the local bit line is suppressed by setting the number of memory cells connected to the local bit lines BL0-0, BL0-0B to a small value of 16.

The one-side bit line read system can easily attain the high speed operation in comparison with a system in which a differential amplification type sense amplifier is connected to paired bit lines even when a variation in the transistor characteristic becomes larger with miniaturization of the transistors. Further, since it is not necessary to connect a differential amplification type sense amplifier to paired bit lines, an increase in the cell area due to addition of the reading stage can be suppressed to minimum. As a reference document of the one-side bit line read system, K. Zhang et al., "The Scaling of Data Sensing for High Speed Cache Design in Sub-0.18 μm Technologies", Tech. Dig. Of VLSI Circuits Symp. 2000, June 2000, pp. 226–227 is provided.

In the first embodiment having the SRAM shown in FIG. 3, the data holding section 11 and reading stage 12 are separately provided and the threshold voltages of the transistors thereof can be independently set to optimum values so that the static noise margin of the data holding section 11 can be made larger and the cell current of the reading stage 12 can be increased. The gate of the reading stage 12 is simply connected to the storage node of the data holding section 11 and it does not give an influence on the operation of the data holding section 11. Therefore, addition of the reading stage 12 does not give a bad influence on the static noise margin. In practice, a large cell current Ic and large static noise margin can be simultaneously attained by using transistors having low threshold voltage in the reading stage 12 and using transistors having high threshold voltage in the data holding section 11. Further, the cell current can be acquired as the total sum of a current Ic by use of which the driver transistor DR3 of the reading stage 12 drives the bit line BL and a current Ic' by use of which the driver transistor DR1 of the data holding section 11 drives the bit line BL. This is advantageous in acquiring a large current.

Figure 5:
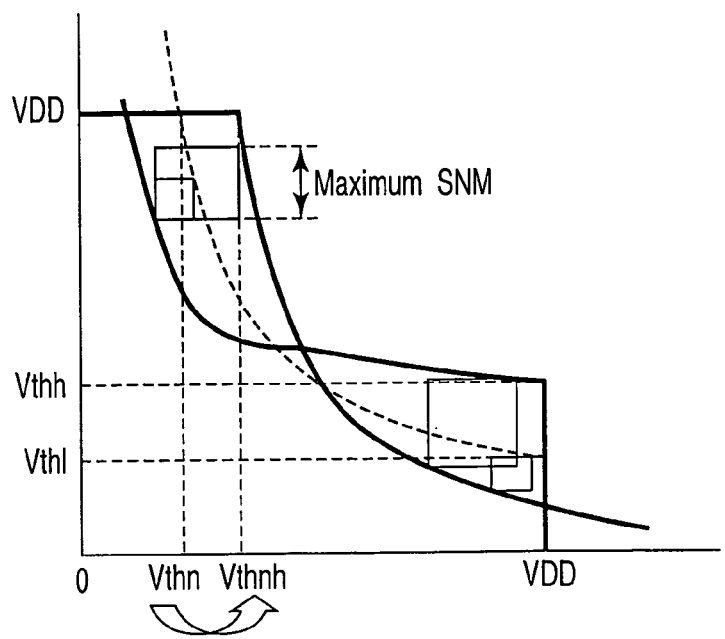
FIG. 5 is a diagram showing an increase in the static noise margin when a transistor with high threshold voltage is used in a data holding section in the first embodiment.

FIG. 5 is a diagram schematically showing an increase in the static noise margin by using transistors with high threshold voltage in the data holding section. As shown in FIG. 5, it is understood that the length of one side of the maximum squares which internally touches the two regions surrounded by the two transfer curves becomes larger and the static noise margin (SNM) increases when the threshold voltage is set higher from Vthn to Vthh or from Vthl to Vthh.

Figure 6:
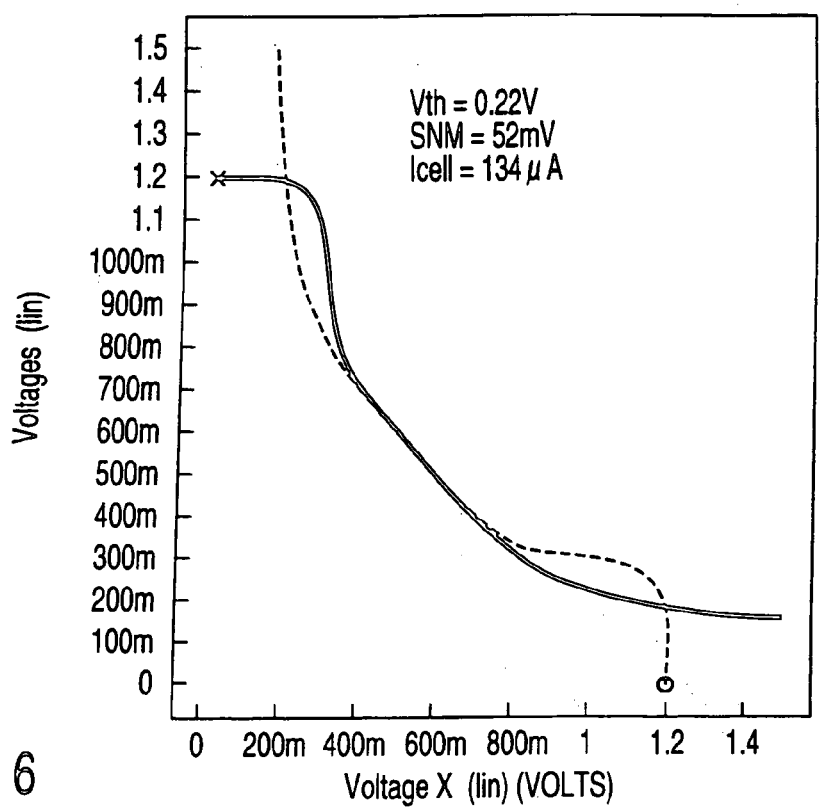
FIG. 6 is a diagram showing the static noise margin of the prior art derived by simulation.
Figure 7:
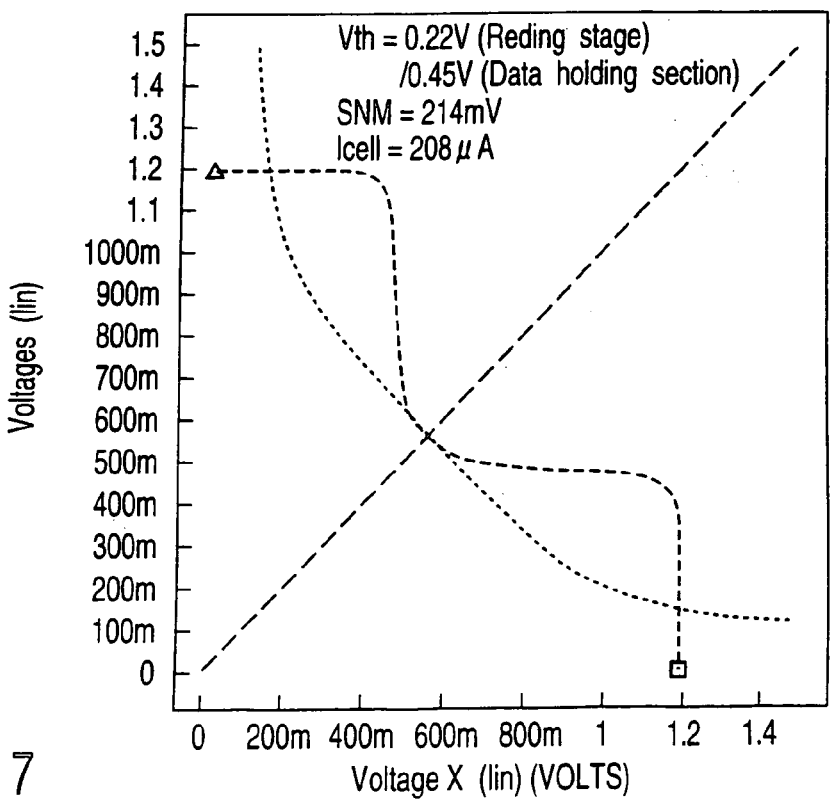
FIG. 7 is a diagram showing the static noise margin of the first embodiment derived by simulation.

FIG. 6 is a diagram showing the static noise margin of the prior art derived by simulation and FIG. 7 is a diagram showing the static noise margin of the first embodiment derived by simulation. In the simulation, it is assumed that transistors corresponding to the 90 nm technology are used. In this case, the sizes of the transistors are as follows.

<Conventional Memory Cell Configured by Six Transistors and Data Holding Section of First Embodiment>
Transfer gate transistors T1, T2, TR1, TR2: W/L=0.24 μm/0.08 μm
Driver transistors D1, D2, DR1, DR2: W/L=0.35 μm/0.08 μm
Load transistors L1, L2, LO1, LO2: W/L=0.12 μm/0.08 μm <Reading Stage of First Embodiment>
Transfer gate transistor TR3: W/L=0.24 μm/0.08 μm
Read driver transistor DR3: W/L=0.35 μm/0.08 μm The threshold voltage Vth of the transistors in the conventional memory cell configured by six transistors and the reading stage 12 of the first embodiment is 0.22 V and the threshold voltage Vth of the transistors in the data holding section 11 of the first embodiment is 0.45 V. Based on the simulation result, it is understood that the static noise margin in the prior art case is 52 mV and the static noise margin in the first embodiment is 214 mV. Therefore, the static noise margin in the first embodiment is increased to approximately four times that of the prior art case. Further, the cell current in the prior art case is 134 μA and the cell current in the first embodiment is 208 μA. As the cell current in the first embodiment, a current which is approximately 1.5 times that of the prior art case can be obtained.

Figure 1:
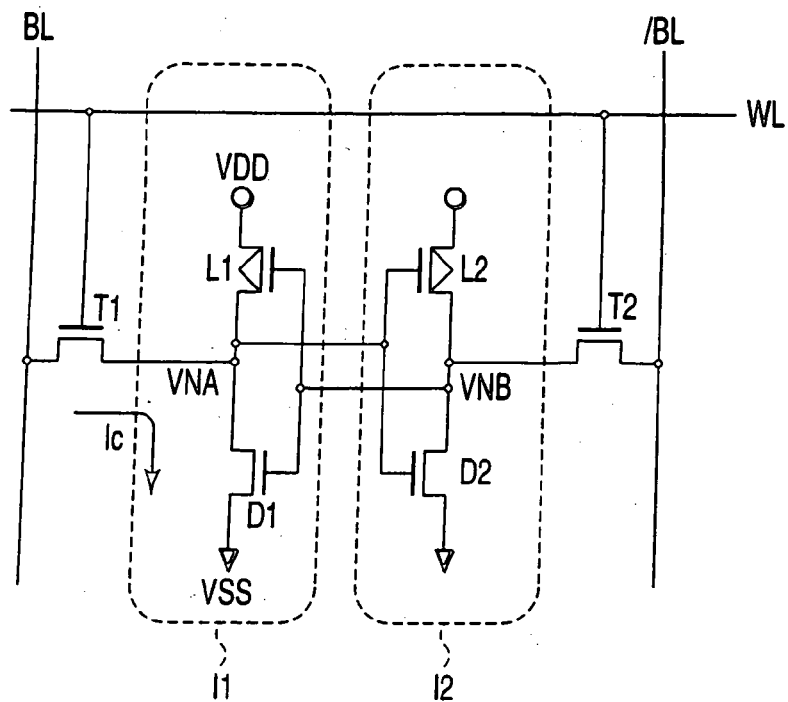
FIG. 1 is a circuit diagram of a memory cell (SRAM cell) configuring the conventional 6-transistor type static random access memory.
Figure 2:
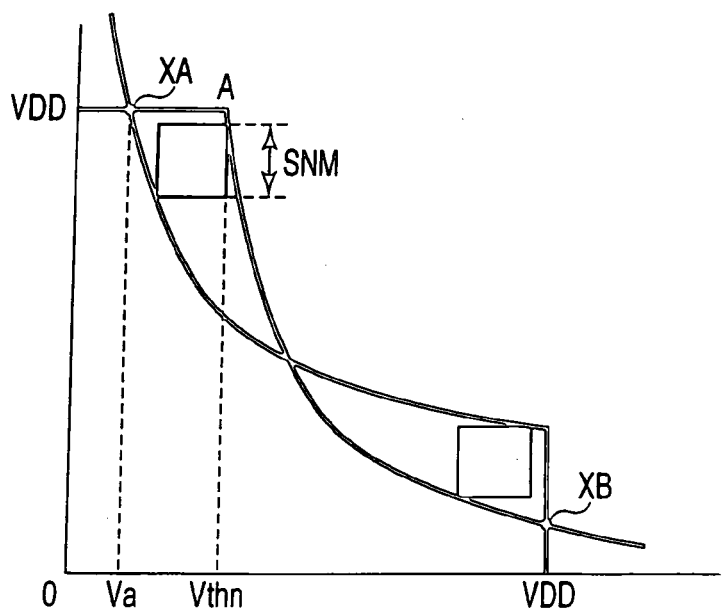
FIG. 2 is a diagram showing a bistable characteristic (butterfly curve) indicating the data storage stability in the conventional SRAM cell.
Figure 8:
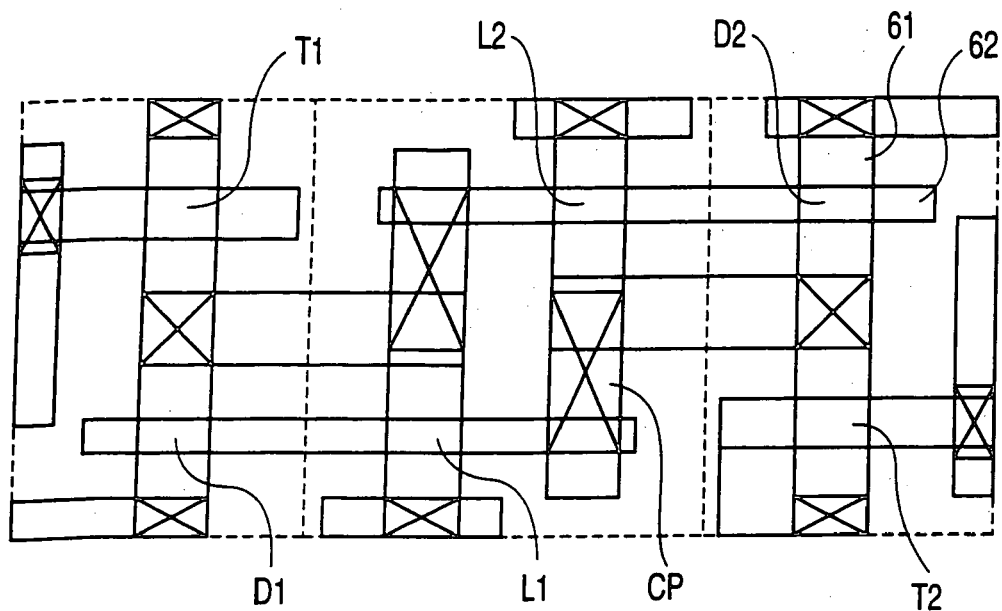
FIG. 8 is a diagram showing the layout of the conventional SRAM cell.
Figure 9:
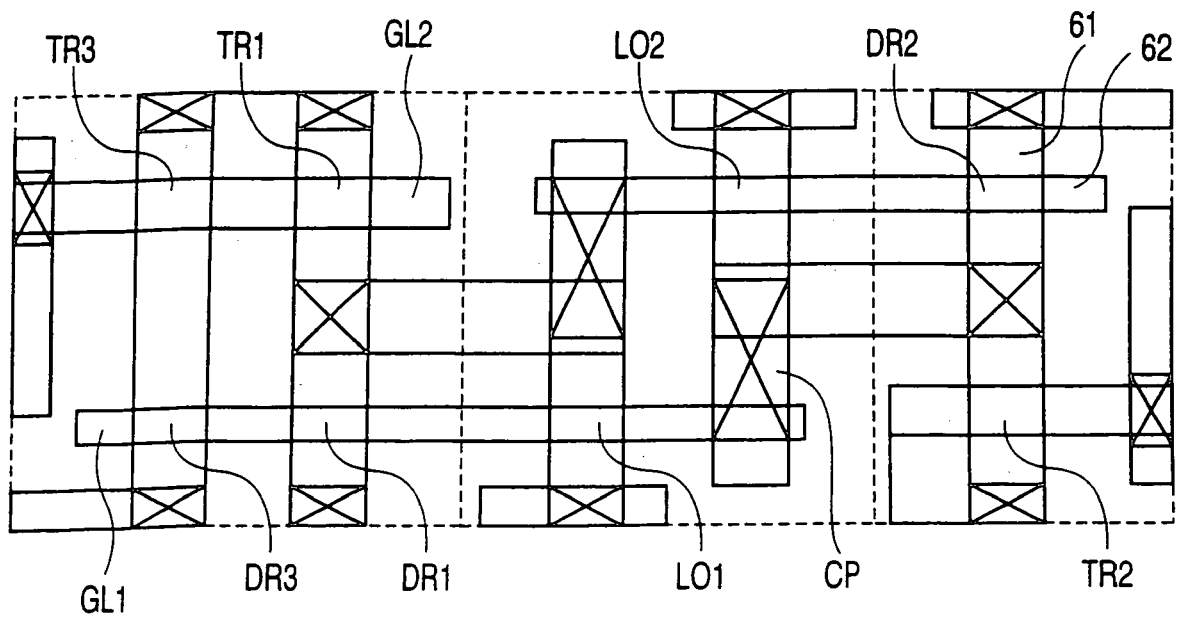
FIG. 9 is a diagram showing the layout of the SRAM cell of the first embodiment.

FIG. 8 shows the layout of the conventional SRAM cell shown in FIG. 1 and FIG. 9 shows the layout of the SRAM cell of the first embodiment. Regions indicated by X marks in FIGS. 8 and 9 indicate contacts CP which connect upper and lower layers. In this case, in the layouts of the first embodiment and the prior art case, diffusion layers 61 are arranged to extend in the vertical direction and gate layers 62 are arranged to extend in the lateral direction. The layout has a feature that the diffusion layer and gate layer can be easily subjected to a lithography process because of the feature that the diffusion layer 61 is arranged in the vertical direction and the gate layer 62 is arranged in the lateral direction.

In the first embodiment shown in FIG. 9, the first, second transfer gate transistors TR1, TR2, first, second load transistors LO1, LO2 and first, second driver transistors DR1, DR2 are formed on the semiconductor substrate. The first transfer gate transistor TR1, first load transistor LO1 and first driver transistor DR1 and the second transfer gate transistor TR2, second load transistor LO2 and second driver transistor DR2 are arranged in a point symmetrical configuration with the central point between the first and second load transistors LO1 and LO2 set as a reference on the semiconductor substrate. Thus, a so-called point symmetrical layout is attained.

The third transfer gate transistor TR3 and read driver transistor DR3 are also formed on the semiconductor substrate. The gate of the first load transistor LO1, the gate of the first driver transistor DR1 and the gate of the read driver transistor DR3 are configured by a first gate wiring GL1 which is linearly formed on the semiconductor substrate. Further, the gate of the first transfer gate transistor TR1 and the gate of the third transfer gate transistor TR3 are configured by a second gate wiring GL2 which is linearly formed on the semiconductor substrate.

Thus, in the layout of the first embodiment shown in FIG. 9, the third transfer gate transistor TR3 and read driver transistor DR3 can be additionally provided while the advantage of the point-symmetrical cell is actively used. An increase in the cell area of the SRAM cell of the first embodiment with respect to the conventional SRAM cell can be suppressed within 17%.

Figure 10:
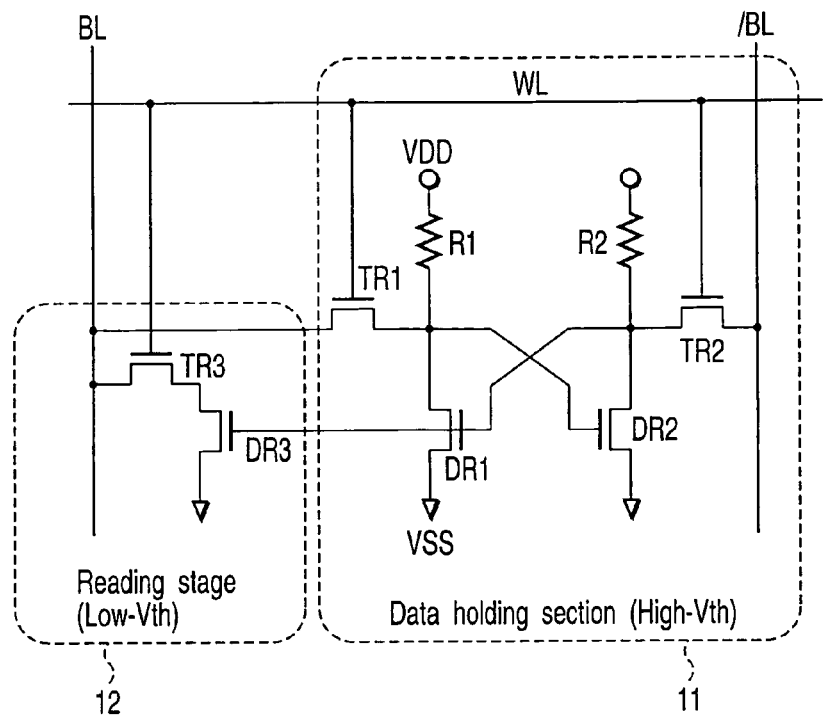
FIG. 10 is a circuit diagram of a memory cell in a static random access memory according to a modification of the first embodiment.

FIG. 10 is a circuit diagram showing the configuration of an SRAM cell according to a modification of the first embodiment. The modification is obtained by replacing the load transistors LO1, LO2 configured by the PMOS transistors in the first embodiment shown in FIG. 3 by resistors R1, R2. With the above configuration, the same effect as that of the first embodiment can be attained.

As described above, the first embodiment is configured by eight transistors including the six transistors configuring the data holding section and the two NMOS transistors configuring the reading stage. The threshold voltage of the NMOS transistors configuring the reading stage is set low and the threshold voltage of the six transistors configuring the data holding section is set higher than the threshold voltage of the NMOS transistors configuring the reading stage. Thus, the cell current flowing from the bit line to the ground terminal can be set large and the large static noise margin (SNM) can be attained. As a result, the operation speed can be enhanced and the reliability of data storage can be enhanced.

Second Embodiment

Next, a semiconductor integrated circuit device containing an SRAM according to a second embodiment of the present invention is explained. The same reference symbols are attached to the same portions as those in the configuration of the first embodiment.

Figure 11:
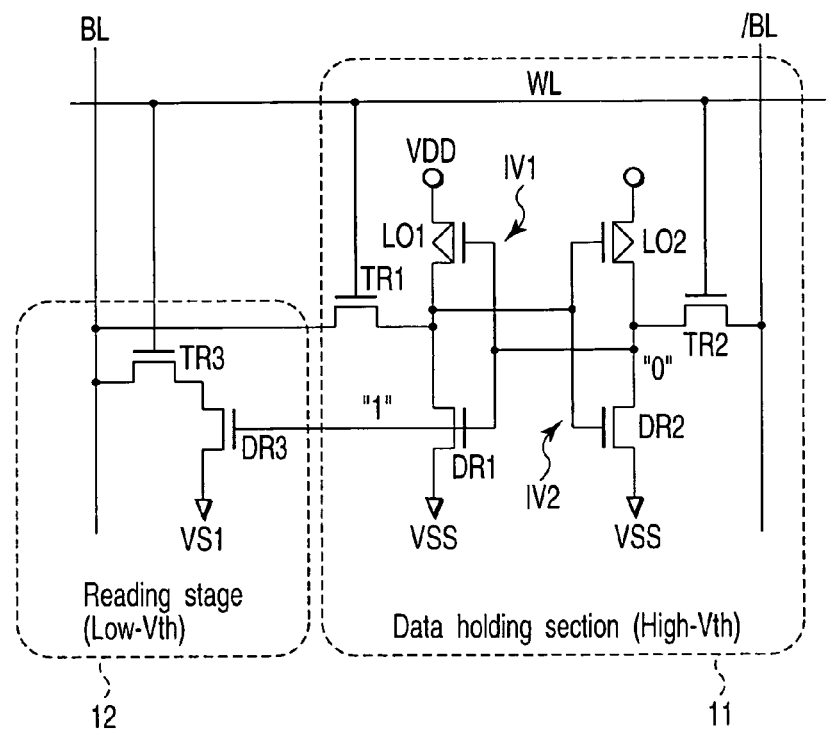
FIG. 11 is a circuit diagram of a memory cell in a static random access memory according to a second embodiment of the present invention.

FIG. 11 is a circuit diagram showing the configuration of an SRAM according to the second embodiment of the present invention. In the first embodiment shown in FIG. 3, voltage supplied to the source terminal of the read driver transistor DR3 is fixed at the reference voltage such as the ground potential. On the other hand, in the second embodiment, voltage VS1 supplied to the source terminal of the read driver transistor DR3 is not fixed at the reference voltage such as the ground potential. Further, the voltage is selectively set at the ground potential or voltage such as the power supply voltage VDD higher than the ground potential. The other configuration is the same as that of the first embodiment.

The source terminal of the read driver transistor DR3 of the reading stage 12 is separated from the ground terminal to which the ground potential VSS of the data holding section 11 is supplied. Voltage VS1 supplied to the source terminal of the read driver transistor DR3 is set at ground potential, for example, 0 V at the normal operation time and set at voltage such as the power supply voltage VDD higher than the ground potential at the standby time. Thus, the channel leak current of the two NMOS transistors in the reading stage 12 in the standby state can be cut off. As a result, a leak current in the reading stage can be suppressed in the second embodiment although there occurs a phenomenon that a leak current in the reading stage becomes larger by using the NMOS transistor of low threshold voltage in the first embodiment.

Third Embodiment

Next, a semiconductor integrated circuit device containing an SRAM according to a third embodiment of the present invention is explained. The same reference symbols are attached to the same portions as those in the configuration of the first embodiment.

Figure 12:
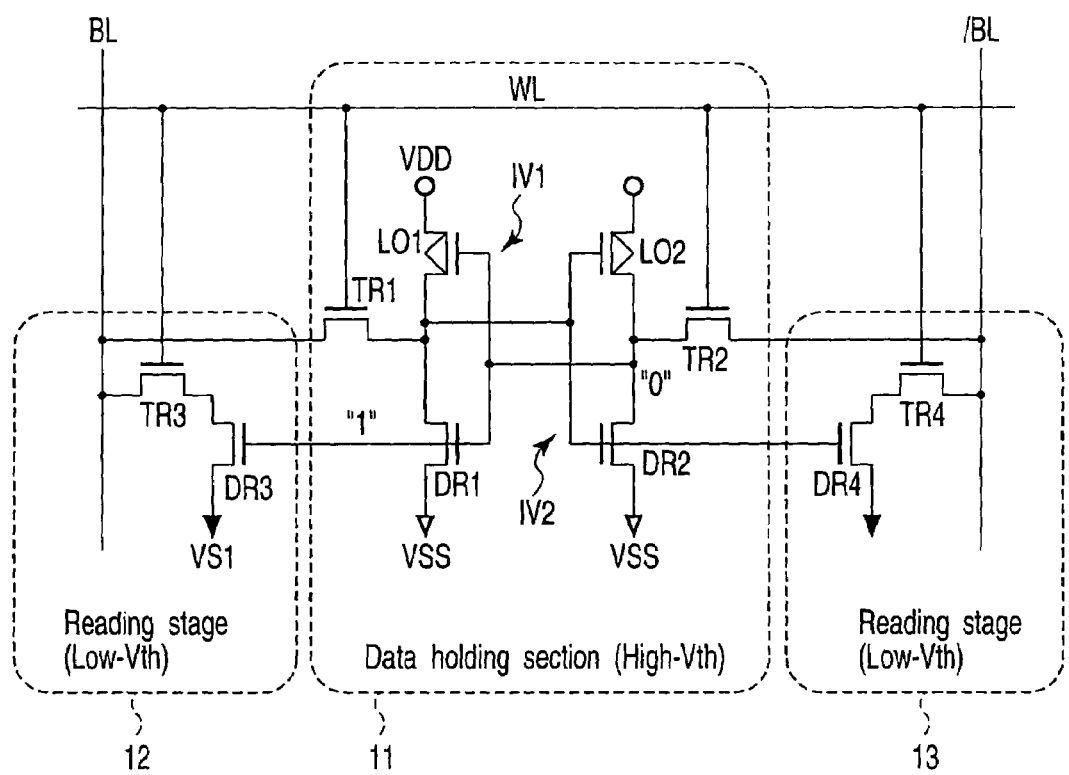
FIG. 12 is a circuit diagram of a memory cell in a static random access memory according to a third embodiment of the present invention.

FIG. 12 is a circuit diagram of an SRAM cell according to the third embodiment of the present invention. The SRAM cell of the first and second embodiments is an 8-transistor type cell based on the one-side bit line read system, but the SRAM cell of the third embodiment is a 10-transistor type cell based on the both-side bit line read system. A reading stage 13 is also provided on the bit line /BL side to configure an SRAM cell configured by ten transistors. The reading stage 13 additionally includes a fourth transfer gate transistor TR4 and read driver transistor DR4. The cell area of the SRAM cell is increased by 40% in comparison with that of the conventional 6-transistor type SRAM cell, but the read operation of higher speed in comparison with that of the first, second embodiments can be performed if a differential sense amplifier which can suppress a variation in the transistor characteristic and is highly sensitive can be formed.

According to the embodiment of the present invention, a static random access memory in which the stability of data storage in the SRAM cell can be enhanced and the cell current is increased to enhance the operation speed can be provided.

Further, each of the above embodiments can be independently performed and the embodiments can be adequately combined and performed. In addition, inventions of various stages can be contained in each of the embodiments and the inventions of various stages can be extracted by adequately combining a plurality of constituents disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a first inverter having a first input terminal and a first output terminal;
a second inverter having a second input terminal connected to the first output terminal of the first inverter and a second output terminal connected to the first input terminal of the first inverter;
a first transfer gate transistor having a first gate terminal and one end and the other end of a first current path, the first gate terminal being connected to a word line, one end of the first current path being connected to a first bit line and the other end of the first current path being connected to the first output terminal of the first inverter and the second input terminal of the second inverter;
a second transfer gate transistor having a second gate terminal and one end and the other end of a second current path, the second gate terminal being connected to the word line, one end of the second current path being connected to a second bit line and the other end of the second current path being connected to the second output terminal of the second inverter and the first input terminal of the first inverter;
a third transfer gate transistor having a third gate terminal and one end and the other end of a third current path, the third gate terminal being connected to the word line and one end of the third current path being connected to the first bit line; and
a read driver transistor having a fourth gate terminal and one end and the other end of a fourth current path, the fourth gate terminal being connected to the first input terminal of the first inverter and the second output terminal of the second inverter, one end of the fourth current path being connected to the other end of the third current path of the third transfer gate transistor and the other end of the fourth current path being supplied with ground potential,
wherein the first inverter includes a first load transistor and a first driver transistor, one end of a fifth current path of the first load transistor being supplied with power supply voltage, one end of a sixth current path of the first driver transistor being connected to the other end of the fifth current path and the other end of the sixth current path being supplied with ground potential,
the second inverter includes a second load transistor and a second driver transistor, one end of a seventh current path of the second load transistor being supplied with the power supply voltage, one end of an eighth current path of the second driver transistor being connected to the other end of the seventh current path and the other end of the eighth current path being supplied with the ground potential,
the first, second transfer gate transistors, the first, second load transistors and the first, second driver transistors are formed on a semiconductor substrate,
and the first transfer gate transistor, first load transistor and first driver transistor and the second transfer gate transistor, second load transistor and second driver transistor are arranged in a point symmetrical configuration with a central point between the first and second load transistors set as a reference on the semiconductor substrate.

2. The semiconductor integrated circuit device according to claim 1, wherein the third transfer gate transistor and the read driver transistor are formed on the semiconductor substrate, gates of the first load transistor, first driver transistor and read driver transistor are configured by a first gate wiring which is linearly formed on the semiconductor substrate, and gates of the first transfer gate transistor and third transfer gate transistor are configured by a second gate wiring which is linearly formed on the semiconductor substrate.

3. A semiconductor integrated circuit device comprising:
a first inverter having a first input terminal and a first output terminal;
a second inverter having a second input terminal connected to the first output terminal of the first inverter and a second output terminal connected to the first input terminal of the first inverter;
a first transfer gate transistor having a first gate terminal and one end and the other end of a first current path, the first gate terminal being connected to a word line, one end of the first current path being connected to a first bit line and the other end of the first current path being connected to the first output terminal of the first inverter and the second input terminal of the second inverter;
a second transfer gate transistor having a second gate terminal and one end and the other end of a second current path, the second gate terminal being connected to the word line, one end of the second current path being connected to a second bit line and the other end of the second current path being connected to the second output terminal of the second inverter and the first input terminal of the first inverter;
a third transfer gate transistor having a third gate terminal and one end and the other end of a third current path, the third gate terminal being connected to the word line and one end of the third current path being connected to the first bit line; and
a read driver transistor having a fourth gate terminal and one end and the other end of a fourth current path, the fourth gate terminal being connected to the first input terminal of the first inverter and the second output terminal of the second inverter, one end of the fourth current path being connected to the other end of the third current path of the third transfer gate transistor and the other end of the fourth current path being supplied with one of ground potential and potential higher than the ground potential,
wherein the first inverter includes a first load transistor and a first driver transistor, one end of a fifth current path of the first load transistor being supplied with power supply voltage, one end of a sixth current path of the first driver transistor being connected to the other end of the fifth current path and the other end of the sixth current path being supplied with ground potential,
the second inverter includes a second load transistor and a second driver transistor, one end of a seventh current path of the second load transistor being supplied with the power supply voltage, one end of an eighth current path of the second driver transistor being connected to the other end of the seventh current path and the other end of the eighth current path being supplied with the ground potential,
the first, second transfer gate transistors, the first, second load transistors and the first, second driver transistors are formed on a semiconductor substrate, and
the first transfer gate transistor, first load transistor and first driver transistor and the second transfer gate transistor, second load transistor and second driver transistor are arranged in a point symmetrical configuration with a central point between the first and second load transistors set as a reference on the semiconductor substrate.

4. The semiconductor integrated circuit device according to claim 3, wherein the third transfer gate transistor and the read driver transistor are formed on the semiconductor substrate, gates of the first load transistor, first driver transistor and read driver transistor are configured by a first gate wiring which is linearly formed on the semiconductor substrate, and gates of the first transfer gate transistor and third transfer gate transistor are configured by a second gate wiring which is linearly formed on the semiconductor substrate.

5. A semiconductor integrated circuit device comprising:
a plurality of sub-arrays each having memory cells arranged in a matrix form;
a plurality of first and second local bit lines connected to the memory cells of each of the plurality of sub-arrays;
a first global bit line commonly used by the plurality of first local bit lines;
a second global bit line commonly used by the plurality of second local bit lines;
a plurality of first transfer gates which selectively set one of the connected state and disconnected state between each of the plurality of first local bit lines and the first global bit line;
a plurality of second transfer gates which selectively set one of the connected state and disconnected state between each of the plurality of second local bit lines and the second global bit line; and
a bit line buffer which drives the first global bit line according to potential of the first local bit line;
wherein the memory cell includes:
a first inverter having a first input terminal and a first output terminal;
a second inverter having a second input terminal connected to the first output terminal of the first inverter and a second output terminal connected to the first input terminal of the first inverter;
a first transfer gate transistor having a first gate terminal and one end and the other end of a first current path, the first gate terminal being connected to a word line, one end of the first current path being connected to a first bit line and the other end of the first current path being connected to the first output terminal of the first inverter and the second input terminal of the second inverter;
a second transfer gate transistor having a second gate terminal and one end and the other end of a second current path, the second gate terminal being connected to the word line, one end of the second current path being connected to a second bit line and the other end of the second current path being connected to the second output terminal of the second inverter and the first input terminal of the first inverter;
a third transfer gate transistor having a third gate terminal and one end and the other end of a third current path, the third gate terminal being connected to the word line and one end of the third current path being connected to the first bit line; and
a read driver transistor having a fourth gate terminal and one end and the other end of a fourth current path, the fourth gate terminal being connected to the first input terminal of the first inverter and the second output terminal of the second inverter, one end of the fourth current path being connected to the other end of the third current path of the third transfer gate transistor and the other end of the fourth current path being supplied with ground potential.

* * * * *